(12) United States Patent
Shibata et al.

(10) Patent No.: US 12,238,858 B2
(45) Date of Patent: Feb. 25, 2025

(54) WIRING CIRCUIT BOARD

(71) Applicant: NITTO DENKO CORPORATION, Osaka (JP)

(72) Inventors: Shusaku Shibata, Osaka (JP); Teppei Niino, Osaka (JP); Yosuke Nakanishi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 10 days.

(21) Appl. No.: 18/054,014

(22) Filed: Nov. 9, 2022

(65) Prior Publication Data

US 2023/0141402 A1    May 11, 2023

(30) Foreign Application Priority Data

Nov. 10, 2021 (JP) ................... 2021-183757

(51) Int. Cl.
*H05K 1/02* (2006.01)
(52) U.S. Cl.
CPC .................. *H05K 1/0296* (2013.01)
(58) Field of Classification Search
CPC ........ H05K 1/02; H05K 1/0296; H01L 33/62; H01L 33/38
USPC .......................................... 174/251
See application file for complete search history.

(56) References Cited

U.S. PATENT DOCUMENTS

2023/0044364 A1 * 2/2023 Bae .................. H01L 25/0753

FOREIGN PATENT DOCUMENTS

| JP | H10-308397 A | 11/1998 |
| JP | H11-233906 A | 8/1999 |
| JP | 2002-231576 A | 8/2002 |
| JP | 2018-137254 A | 8/2018 |

OTHER PUBLICATIONS

Non-Final Office Action which was issued in U.S. Appl. No. 18/054,029 on Jul. 18, 2024.

* cited by examiner

*Primary Examiner* — Tremesha W Burns
(74) *Attorney, Agent, or Firm* — Edwards Neils LLC; Jean C. Edwards, Esq.

(57) ABSTRACT

Provided is a wiring circuit board that includes a first insulating layer, a conductive pattern disposed on the first insulating layer, and a second protective layer disposed between the first insulating layer and protecting the conductive pattern. The second protective layer consists of a metal oxide.

7 Claims, 5 Drawing Sheets

WIRING CIRCUIT BOARD

CROSS-REFERENCE TO RELATED APPLICATION

The present application claims priority from Japanese Patent Application No. 2021-183757 filed on Nov. 10, 2021, the contents of which are hereby incorporated by reference into this application.

BACKGROUND ART

The present invention relates to a wiring circuit board.

There have been proposed circuit boards each including an insulating layer, a conductive circuit disposed on the insulating layer, a cover layer covering the conductive circuit, a chromium thin film and a copper thin film both of which are disposed between the insulating layer and the conductive circuit, and a metal thin film disposed between the cover layer and the conductive circuit (for example, see Patent document 1 below).

CITATION LIST

Patent Document

Patent Document 1: Japanese Unexamined Patent Publication No. H11-233906

SUMMARY OF THE INVENTION

Problem to be Solved by the Invention

There is a need for the reduction in the content of heavy metals having a large environmental impact, such as chromium, in the circuit board as described in Patent Document 1.

The present invention provides a wiring circuit board that allows the reduction in the content of heavy metals having a large environmental impact therein.

Means for Solving the Problem

The present invention [1] includes a wiring circuit board comprising: a first insulating layer; a conductive pattern disposed on the first insulating layer; and a protective layer disposed between the first insulating layer and the conductive pattern and protecting the conductive pattern, wherein the protective layer consists of a metal oxide.

The present invention [2] includes the wiring circuit board described in [1], further comprising: a second insulating layer disposed on the first insulating layer and covering the conductive pattern, wherein the protective layer is an insulator and disposed also between the first insulating layer and the second insulating layer.

The present invention [3] includes the wiring circuit board described in [1] or [2], further comprising: a metal supporting layer disposed at an opposite side to the conductive pattern with respect to the first insulating layer and supporting the first insulating layer and the conductive pattern; and a second protective layer disposed between the first insulating layer and the metal supporting layer and protecting the metal supporting layer.

The present invention [4] includes the wiring circuit board described in any one of [1] to [3], wherein the protective layer contains aluminum.

The present invention [5] includes the wiring circuit board described in any one of [1] to [4], wherein the protective layer contains aluminum oxide.

Effects of the Invention

In the wiring circuit board of the present invention, the protective layer disposed between the first insulating layer and the conductive pattern consists of a metal oxide.

Thus, as compared to a case in which the protective layer consists of a heavy metal such as chromium, the content of heavy metals having a large environmental impact can be reduced.

Not only the heavy metal content in the wiring circuit board but also the heavy metal effluent discharged in the production process of the wiring circuit board can be reduced.

BRIEF DESCRIPTION OF THE DRAWINGS

FIG. 3A illustrates a step of preparing a supporting layer. FIG. 3B illustrates a step of forming a first protective layer on the supporting layer. FIG. 3C illustrates a step of forming a first insulating layer on the first protective layer and then a second protective layer on the first insulating layer. FIG. 3D illustrates a step of removing the second protective layer in the via by etching. FIG. 3E illustrates a step of forming a conductive pattern on the second protective layer. FIG. 3F illustrates a step of forming a third protective layer on the conductive pattern.

DESCRIPTION OF THE EMBODIMENT

1. Wiring Circuit Board

Figure 1:
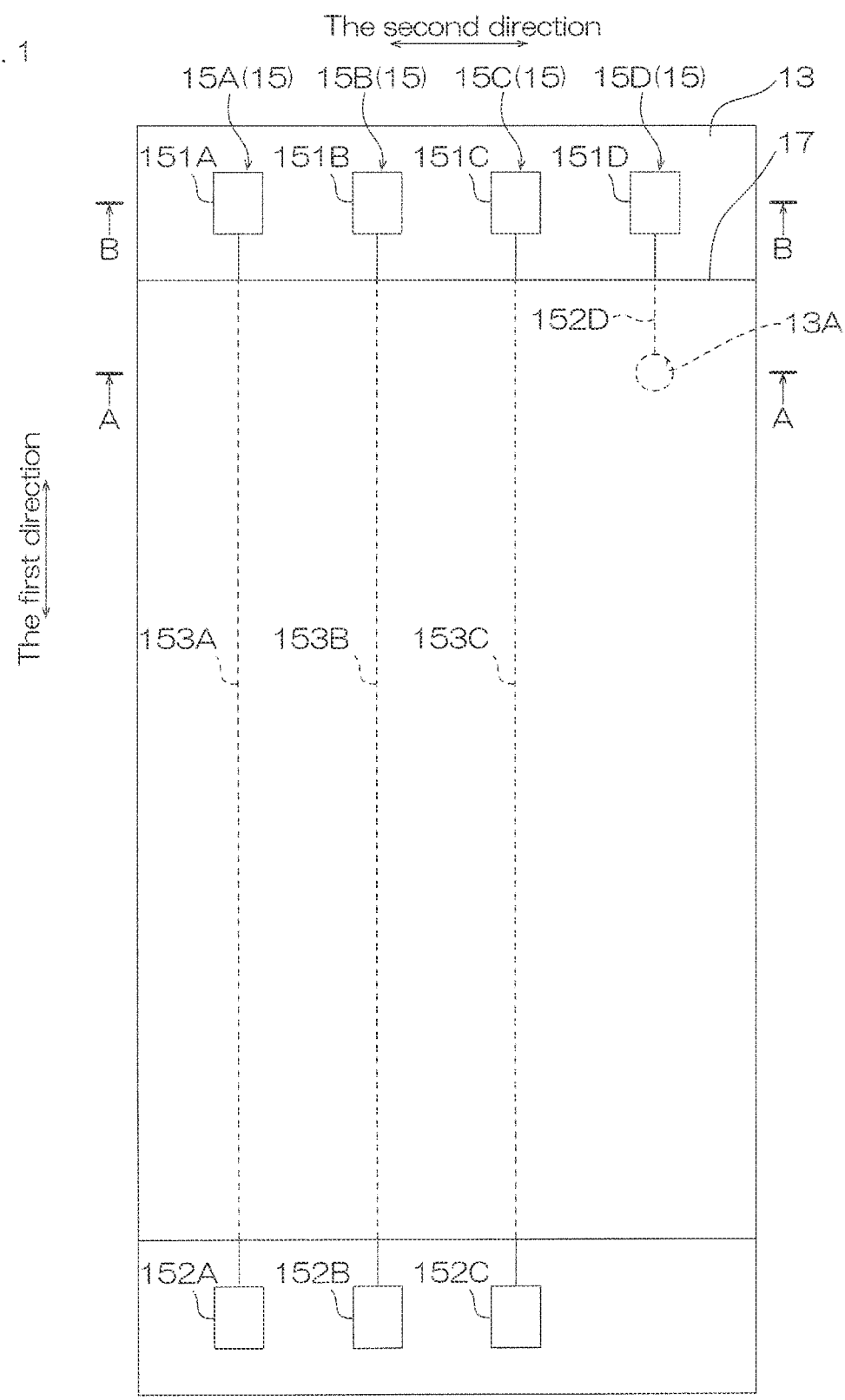
FIG. 1 is a plan view of a wiring circuit board as one embodiment of the present invention.

As shown in FIG. 1, a wiring circuit board 1 extends in a first direction and a second direction. In the present embodiment, the wiring circuit board 1 has an approximately rectangular shape. The shape of the wiring circuit board 1 is not limited.

Figure 2A:
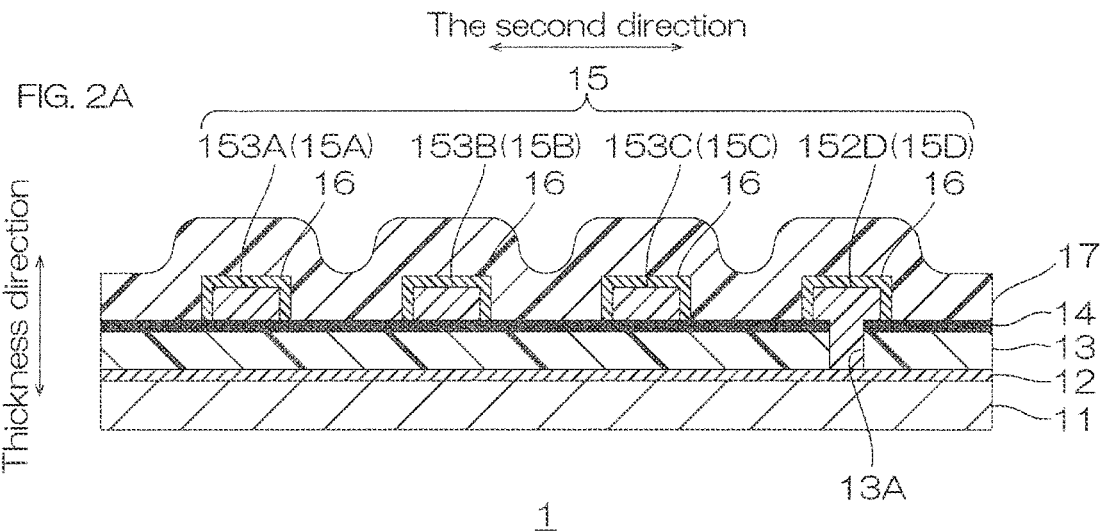
FIG. 2A is a cross-sectional view of the wiring circuit board of FIG. 1, taken along line A-A.
Figure 2B:
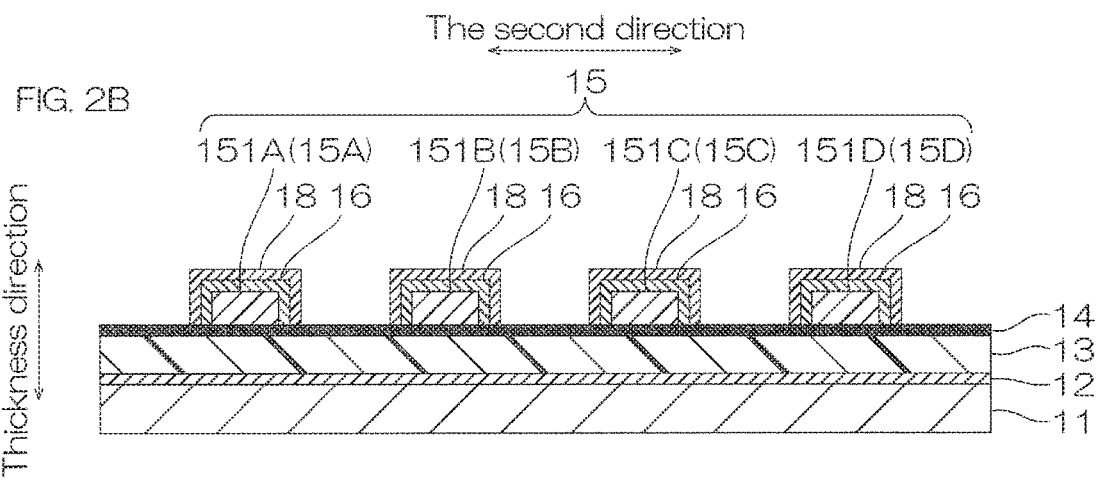
FIG. 2B is a cross-sectional view of the wiring circuit board of FIG. 1, taken along line B-B.

As shown in FIG. 2A and FIG. 2B, the wiring circuit board 1 includes a supporting layer 11, a first protective layer 12, a first insulating layer 13, a second protective layer 14 as an example of the protective layer, a conductive pattern 15, a third protective layer 16, a second insulating layer 17, and a plating layer 18.

(1) Supporting Layer

The supporting layer 11 supports the first protective layer 12, the first insulating layer 13, the second protective layer 14, the conductive pattern 15, the third protective layer 16, and the second insulating layer 17. In the present embodiment, the supporting layer 11 consists of a metal. Examples of the metal include stainless steel and copper alloys.

(2) The First Protective Layer

The first protective layer 12 is disposed on the supporting layer 11 in a thickness direction of the wiring circuit board 1. The thickness direction is orthogonal to the first direction and the second direction. The first protective layer 12 is disposed between the supporting layer 11 and the first insulating layer 13. The first protective layer 12 protects the supporting layer 11. The first protective layer 12 consists of a metal. Examples of the metal include chromium, nickel, titanium, and alloys thereof.

(3) The First Insulating Layer

The first insulating layer 13 is disposed on the first protective layer 12 in the thickness direction. In other words, the first insulating layer 13 is disposed on the supporting layer 11 through the first protective layer 12 in the thickness direction. The first insulating layer 13 is disposed between the supporting layer 11 and the conductive pattern 15. The first insulating layer 13 insulates the first protective layer 12 from the conductive pattern 15. The first insulating layer 13 consists of resin. Examples of the resin include polyimide, maleimide, epoxy resin, polybenzoxazole, and polyester. In the present embodiment, the first insulating layer 13 has a via hole 13A.

(4) The Second Protective Layer

The second protective layer 14 is disposed on the first insulating layer 13 in the thickness direction. The second protective layer 14 is disposed between the conductive pattern 15 and the first insulating layer 13. The second protective layer 14 protects the conductive pattern 15. In detail, the second protective layer 14 is disposed between a wiring pattern 15A and the first insulating layer 13, between a wiring pattern 15B and the first insulating layer 13, between a wiring pattern 15C and the first insulating layer 13, and between a ground pattern 15D and the first insulating layer 13. The wiring patterns 15A, 15B, and 15C, and the ground pattern 15D are described below. In the present embodiment, the second protective layer 14 is an insulator. When the second protective layer 14 is an insulator, the second protective layer 14 may be disposed between the first insulating layer 13 and the second insulating layer 17.

The second protective layer 14 consists of a metal oxide. The second protective layer 14 does not have magnetism. Examples of the metal oxide of the second protective layer 14 include aluminum oxide, zinc oxide, aluminum silicate, silicon dioxide, and magnesium oxide.

Further, the examples of the metal oxide include a metal oxide containing aluminum, silicon, zinc, and inevitable impurities as the metal components, and a metal oxide containing aluminum, gallium, silicon, zinc, and inevitable impurities as the metal components.

The second protective layer 14 preferably contains aluminum. The second protective layer 14 more preferably contains aluminum oxide. As the metal oxide, aluminum oxide and aluminum silicate are preferable.

The ratio of the aluminum in the second protective layer 14 is, for example, 0.5% by mass or more, preferably 0.9% by mass or more. When the ratio of the aluminum in the second protective layer 14 is the above-described lower limit or more, the second protective layer 14 is easily etched in the method of producing the wiring circuit board 1 as described below. The upper limit of the ratio of the aluminum in the second protective layer 14 is not limited. The ratio of the aluminum in the second protective layer 14 is, for example, 60% by mass or less.

Further, the ratio of the aluminum oxide in the second protective layer 14 is, for example, 1% by mass or more, preferably 2% by mass or more. When the ratio of the aluminum oxide in the second protective layer 14 is the above-described lower limit or more, the second protective layer 14 is easily etched in the method of producing the wiring circuit board 1 as described below. The upper limit of the ratio of the aluminum oxide in the second protective layer 14 is not limited. The ratio of the aluminum oxide in the second protective layer 14 is, for example, 100% by mass or less.

The second protective layer 14 has a thickness of, for example, 1 nm or more, preferably 3 nm or more. When the thickness of the second protective layer 14 is the above-described lower limit or more, wires 153A, 153B, 153C, and a ground wire 152D is surely protected. The thickness of the second protective layer 14 is, for example, 100 nm or less, preferably 20 nm or less, more preferably 10 nm or less. When the thickness of the second protective layer 14 is the above-described upper limit or less, the second protective layer 14 is easily etched in the method of producing the wiring circuit board 1 as described below.

(5) Conductive Pattern

The conductive pattern 15 is disposed on the second protective layer 14 in the thickness direction. In other words, the conductive pattern 15 is disposed on the first insulating layer 13 through the second protective layer 14 in the thickness direction. The conductive pattern 15 is disposed on an opposite side to the supporting layer 11 with respect to the first insulating layer 13 in the thickness direction. The conductive pattern 15 consists of a metal. Examples of the metal include copper, silver, gold, iron, aluminum, chromium, and alloys thereof. In view of achieving good electrical properties, copper is preferably used. The shape of the conductive pattern 15 is not limited.

In the present embodiment, as shown in FIG. 1, the conductive pattern 15 has the wiring patterns 15A, 15B, and 15C, and the ground pattern 15D. The wiring patterns 15A, 15B, and 15C, and the ground pattern 15D are aligned in the second direction while being separated from each other by an interval therebetween.

(5-1) Wiring Pattern

The wiring pattern 15A has a terminal 151A, a terminal 152A, and a wire 153A. The wiring pattern 15A electrically connects an electronic appliance connected to the terminal 151A and an electronic appliance connected to the terminal 152A.

The terminal 151A is disposed at one end of the wiring circuit board 1 in the first direction. The terminal 151A has a square land shape.

The terminal 152A is disposed at the other end of the wiring circuit board 1 in the first direction. The terminal 152A has a square land shape.

One end of the wire 153A is connected to the terminal 151A. The other end of the wire 153A is connected to the terminal 152A. The wire 153A electrically connects the terminal 151A and the terminal 152A.

Each of the wiring patterns 15B and 15C is described in the same manner as the wiring pattern 15A. Thus, the description of each of the wiring patterns 15B and 15C is omitted.

(5-2) Ground Pattern

The ground pattern 15D has a ground terminal 151D and a ground wire 152D. The ground pattern 15D connects an electronic appliance connected to the ground terminal 151D with ground through the supporting layer 11.

The ground terminal 151D is disposed at one end of the wiring circuit board 1 in the first direction. The ground terminal 151D has a square land shape. The terminals 151A, 151B, and 151C, and the ground terminal 151D are aligned in the second direction while being separated from each other by an interval therebetween.

One end of the ground wire 152D is connected to the ground terminal 151D. The other end of the ground wire 152D is connected to the first protective layer 12 through the via hole 13A (see FIG. 2A) of the insulating base layer 13. In this manner, the ground wire 152D is electrically connected with the supporting layer 11 through the first protective layer 12.

(6) The Third Protective Layer

As shown in FIG. 2A and FIG. 2B, the third protective layer 16 covers the whole of the conductive pattern 15. The third protective layer 16 is disposed between the conductive pattern 15 and the second insulating layer 17. The third protective layer 16 protects the conductive pattern 15. The third protective layer 16 consists of a metal. Examples of the metal include nickel and nickel phosphorus alloys.

(7) The Second Insulating Layer

As shown in FIG. 1, the second insulating layer 17 covers all the wires 153A, 153B, and 153C, and the ground wire 152D. In other words, the second insulating layer 17 covers the conductive pattern 15. The second insulating layer 17 is disposed on the first insulating layer 13 in the thickness direction. The second insulating layer 17 does not cover the terminals 151A, 151B, and 151C, and the ground terminal 151D, and the terminals 152A, 152B, and 152 C. The second insulating layer 17 consists of a resin. Examples of the resin include polyimide, maleimide, epoxy resin, polybenzoxazole, and polyester.

(8) Plating Layer

As shown in FIG. 2B, the plating layer 18 covers the terminals 151A, 151B, and 151C, and the ground terminal 151D. Although not shown, the plating layer 18 also covers the terminals 152A, 152B, and 152 C. The plating layer 18 may have a plurality of layers. The plating layer 18 consists of a metal. Examples of the metal of the plating layer 18 include gold.

2. Method of Producing Wiring Circuit Board

Next, a method of producing the wiring circuit board 1 is described.

In the present embodiment, the wiring circuit board 1 is produced by an additive method.

Figure 3A:
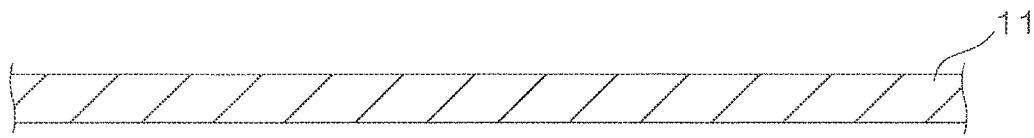
FIG. 3A to FIG. 3F are explanatory views for explaining a method of producing the wiring circuit board.

To produce the wiring circuit board 1, as shown in FIG. 3A, the supporting layer 11 is prepared first. In the present embodiment, the supporting layer 11 is metal foil pulled out of a roll of metal foil.

Figure 3B:
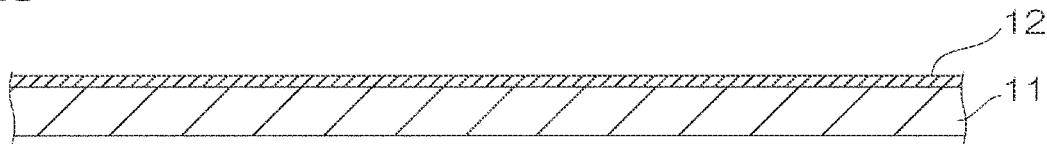

Next, as shown in FIG. 3B, the first protective layer 12 is formed on the supporting layer 11. The first protective layer 12 is formed, for example, by sputtering.

Figure 3C:
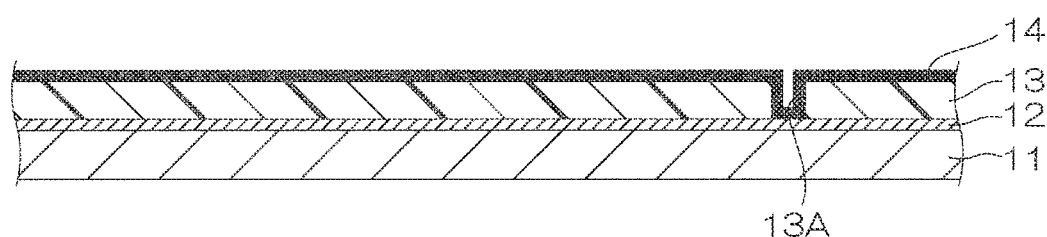

Next, as shown in FIG. 3C, the first insulating layer 13 is formed on the first protective layer 12. To form the first insulating layer 13, first, a solution (varnish) of photosensitive resin is applied and dried on the first protective layer 12 to form a film of the photosensitive resin. Next, the photosensitive resin film is exposed and developed. In this manner, the first insulating layer 13 is formed on the first protective layer 12.

Next, the second protective layer 14 is formed on the first insulating layer 13. The second protective layer 14 is formed, for example, by sputtering. The second protective layer 14 is formed also on an inner peripheral surface of the via hole 13A.

Figure 3D:
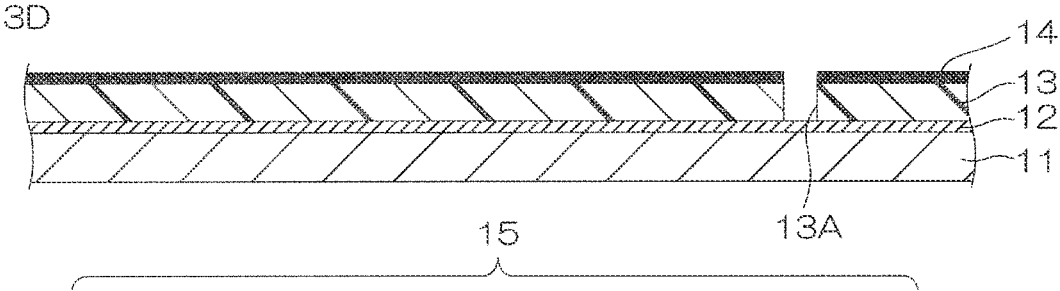

Next, as shown in FIG. 3D, the second protective layer 14 in the via hole 13A is removed by etching with an acid aqueous solution or an alkaline aqueous solution. Preferably, the second protective layer 14 is removed by etching with an acid aqueous solution.

In detail, an etching resist is laminated on the second protective layer 14. The etching resist is exposed while the part on the via hole 13A is shielded from the light.

Next, the exposed etching resist is developed. This development removes the etching resist on the via hole 13A. The second protective layer 14 in the via hole 13A is exposed. The etching resist at the exposed part, i.e., the part that is not etched remains.

Next, the second protective layer 14 in the via hole 13A is etched with an acid aqueous solution or an alkaline aqueous solution. In this manner, the second protective layer 14 in the via hole 13A is removed. After the completion of the etching, the etching resist is released.

The second protective layer 14 in the via hole 13A may be removed by laser etching.

Figure 3E:
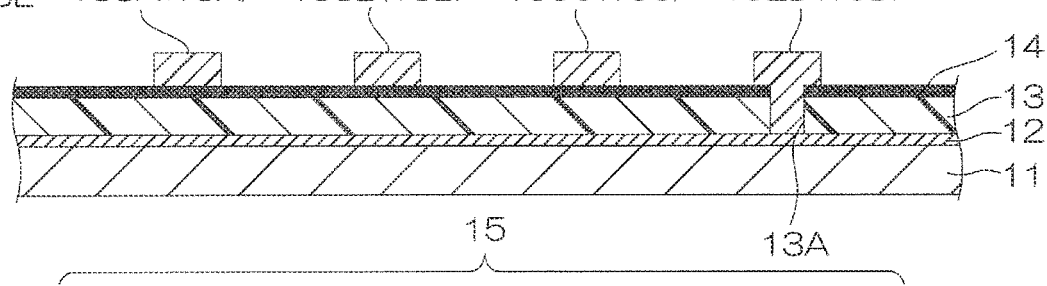

Next, as shown in FIG. 3E, the conductive pattern 15 is formed on the second protective layer 14 by electrolytic plating.

In detail, a plating resist is laminated on the second protective layer 14. The plating resist is exposed while the parts on which the conductive pattern 15 is formed are shielded from the light.

Next, the exposed plating resist is developed. This development removes the plating resist of the shielded parts. The second protective layer 14 is exposed at the parts on which the conductive pattern 15 is formed. The plating resist of the exposed parts, i.e., the parts on which the conductive pattern 15 is not formed remains.

Next, the conductive pattern 15 is formed on the exposed second protective layer 14 by electrolytic plating. The conductive pattern 15 fills the via hole 13A. After the completion of the electrolytic plating, the plating resist is released.

Figure 3F:
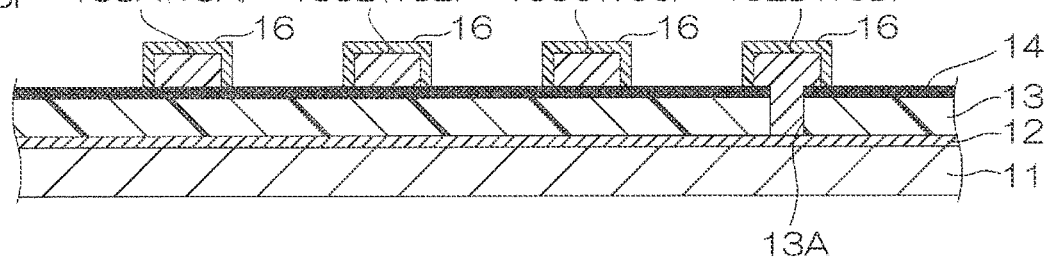

Next, as shown in FIG. 3F, the third protective layer 16 is formed on a surface of the conductive pattern 15 by electroless plating.

Next, as shown in FIG. 2A, in the same manner as the formation of the first insulating layer 13, the second insulating layer 17 is formed on the first insulating layer 13 and the conductive pattern 15. As described above, the second insulating layer 17 covers all the wires 153A, 153B, and 153C, and the ground wire 152D and does not cover the terminals 151A, 151B, and 151C, the ground terminal 151D, and the terminals 152A, 152B, and 152C.

Next, as shown in FIG. 2B, the plating layer 18 is formed on a surface of each of the terminals 151A, 151B, and 151C, the ground terminal 151D, and the terminals 152A, 152B, and 152C by electroless plating.

3. Operations and Effects (1) In the wiring circuit board 1, as shown in FIG. 2A, the second protective layer 14 disposed between the first insulating layer 13 and the conductive pattern 15 consists of a metal oxide.

Thus, as compared to a case in which the second protective layer 14 consists of a heavy metal such as chromium, the content of heavy metals having a large environmental impact can be reduced.

Not only the heavy metal content in the wiring circuit board, but also the heavy metal effluent discharged in the production process of the wiring circuit board 1 can be reduced.

(2) In the wiring circuit board 1, as shown in FIG. 2A, the second protective layer 14 is an insulator and disposed also between the first insulating layer 13 and the second insulating layer 17.

When the second protective layer 14 is a semiconductor or conductor, it is necessary to remove the second protective layer 14 between the first insulating layer 13 and the second insulating layer 17 to prevent the electrical short circuit of each of the wiring patterns 15A, 15B, and 15C, and the ground pattern 15D.

To remove the second protective layer 14 between the first insulating layer 13 and the second insulating layer 17, the step of removing the second protective layer 14 between the first insulating layer 13 and the second insulating layer 17 is required at the time after the formation of the conductive pattern 15 and before the formation of the second insulating layer 17.

In view of this point, when the second protective layer 14 is an insulator, the removal of the second protective layer 14 between the first insulating layer 13 and the second insulating layer 17 is not required, and thus the production process can be simplified.

4. Variations

Next, variations are described. In each of the variations, the same members as in the above-described embodiment are given the same reference numerals and the detailed descriptions thereof are omitted.

Figure 4:
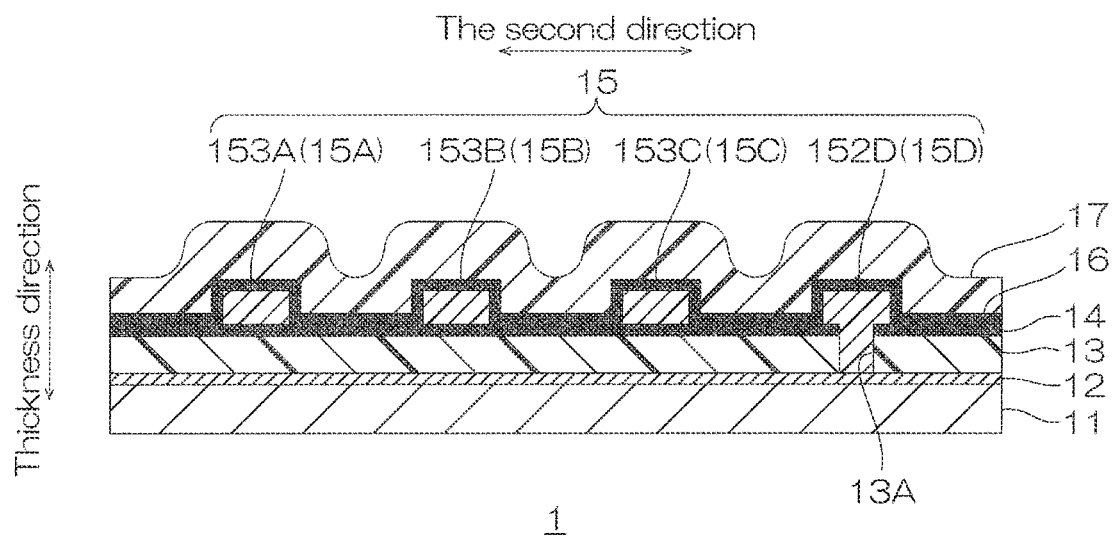
FIG. 4 is an explanatory view for explaining a first variation.

(1) As shown in FIG. 4, the third protective layer 16 may also be formed from a metal oxide. In this case, the third protective layer 16 is formed on the conductive pattern 15 and the second protective layer 14 by, for example, sputtering. After the formation of the second insulating layer 17, the third protective layer 16 that is not covered with the second insulating layer 17 is removed by etching with an acid aqueous solution or an alkaline aqueous solution.

Figure 5:
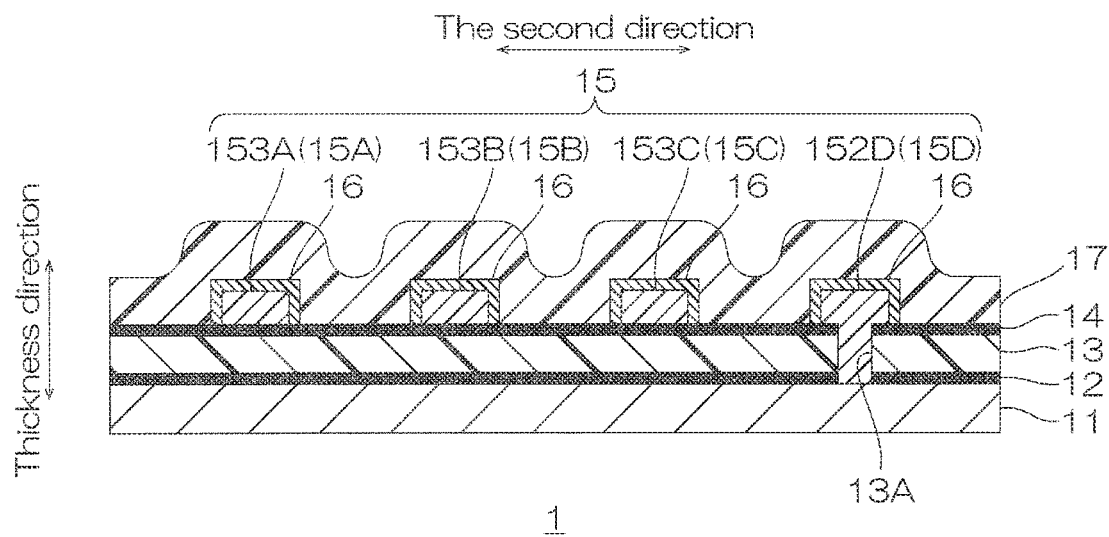
FIG. 5 is an explanatory view for explaining a second variation.

(2) As shown in FIG. 5, the first protective layer 12 may also be formed from a metal oxide. In this case, at the etching of the second protective layer 14 in the via hole 13A, the first protective layer 12 in the via hole 13A is also removed by the etching.

Figure 6:
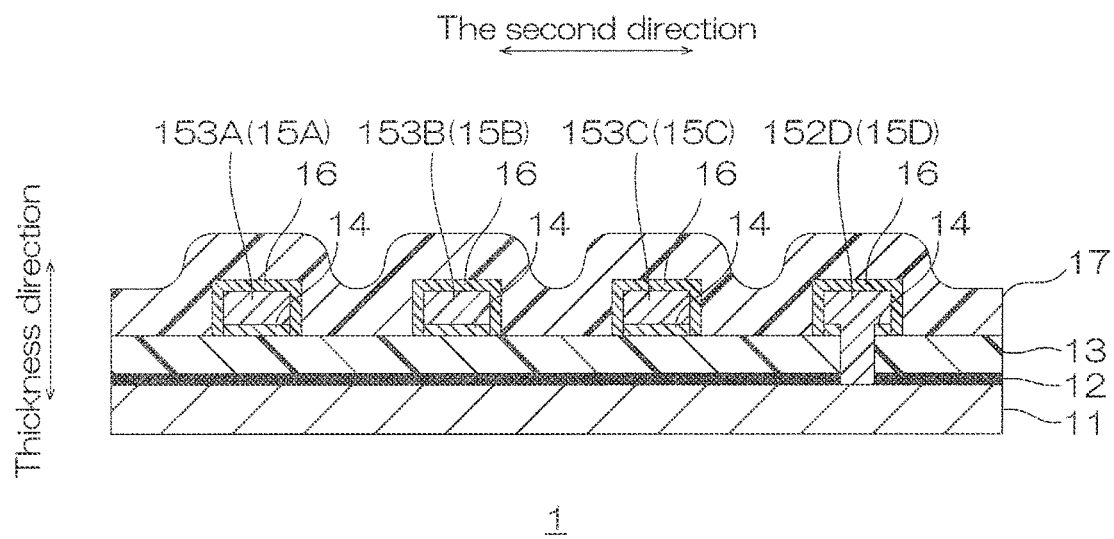
FIG. 6 is an explanatory view for explaining a third variation.

(3) As shown in FIG. 6, among the first protective layer 12, the second protective layer 14, and the third protective layer 16, only the first protective layer 12 may be formed from a metal oxide. In this case, the first protective layer 12 in the via hole 13A is removed by etching after the formation of the first insulating layer 13. After the formation of the conductive pattern 15 on the second protective layer 14, the second protective layer 14 covered with the plating resist is etched with an acid aqueous solution or an alkaline aqueous solution.

Figure 7:
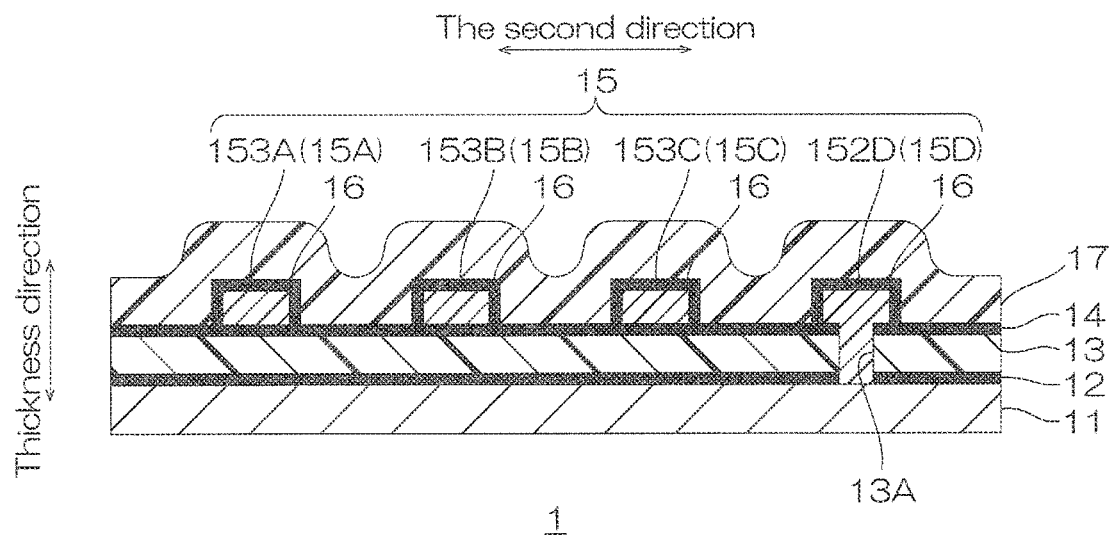
FIG. 7 is an explanatory view for explaining a fourth variation.

(4) As shown in FIG. 7, all of the first protective layer 12, the second protective layer 14, and the third protective layer 16 may be formed from a metal oxide.

(5) The third protective layer 16 may be a semiconductor or a conductor. When the third protective layer 16 is a semiconductor or a conductor, the third protective layer 16 is not disposed between the first insulating layer 13 and the second insulating layer 17. Examples of the semiconductor or conductor include alumina-doped zinc oxide.

The aluminum oxide content in the alumina-doped zinc oxide is, for example, 1% by mass or more, preferably 2% by mass or more, and, for example, 10% by mass or less, preferably 5% by mass or less.

The silicon dioxide content in the alumina-doped zinc oxide is, for example, 10% by mass or more, preferably 15% by mass or more, and, for example, 30% by mass or less, preferably 25% by mass or less.

The zinc oxide content in the alumina-doped zinc oxide is, for example, 40% by mass or more, preferably 60% by mass or more, and, for example, 90% by mass or less, preferably 80% by mass or less.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The wiring circuit board of the present invention is used, for example, for the electrical connection between electronic appliances.

DESCRIPTION OF REFERENCE NUMERALS 1 wiring circuit board
13 first insulating layer
14 second protective layer
15 conductive pattern
17 second insulating layer

The invention claimed is:

1. A wiring circuit board comprising:
a first insulating layer consisting of resin;
a conductive pattern disposed on the first insulating layer, the conductive pattern having a first terminal, a second terminal, and a wire that electrically connects the first terminal and the second terminal;
a protective layer disposed between the first insulating layer and the conductive pattern and protecting the conductive pattern; and
a second insulating layer disposed on the first insulating layer and covering the wire without covering at least a part of the first terminal and at least a part of the second terminal,
wherein the protective layer consists of a metal oxide.

2. The wiring circuit board according to claim 1, wherein the protective layer is an insulator and disposed also between the first insulating layer and the second insulating layer.

3. The wiring circuit board according to claim 1, further comprising:
a metal supporting layer disposed at an opposite side to the conductive pattern with respect to the first insulating layer and supporting the first insulating layer and the conductive pattern; and
a second protective layer disposed between the first insulating layer and the metal supporting layer and protecting the metal supporting layer.

4. The wiring circuit board according to claim 1, wherein the protective layer contains aluminum.

5. The wiring circuit board according to claim 1, wherein the protective layer contains aluminum oxide.

6. The wiring circuit board according to claim 1, wherein the protective layer has a thickness of 100 nm or less.

7. The wiring circuit board according to claim 4, wherein a ratio of the aluminum in the protective layer is 0.5% by mass or more.

* * * * *